(12) United States Patent
Pisati et al.

(10) Patent No.: US 7,061,300 B2
(45) Date of Patent: Jun. 13, 2006

(54) LOW SUPPLY VOLTAGE ANALOG MULTIPLIER

(75) Inventors: Valerio Pisati, Bosnasco (IT); Marco Cazzaniga, Ispra (IT); Alessandro Venca, Tortona (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/797,204

(22) Filed: Feb. 27, 2001

(65) Prior Publication Data

US 2001/0050586 A1 Dec. 13, 2001

(30) Foreign Application Priority Data

Feb. 29, 2000 (IT) .................................... MI2000A0391

(51) Int. Cl.
*G05F 1/10* (2006.01)

(52) U.S. Cl. ..................... 327/357; 327/359; 327/589

(58) Field of Classification Search ................ 327/357, 327/359, 59, 60, 536, 542, 589, 157, 351; 365/189.09, 189.11; 330/254

See application file for complete search history.

(56) References Cited

U.S. PATENT DOCUMENTS 4,978,924 A * 12/1990 Schuster ..................... 330/254
5,302,868 A * 4/1994 Fergus ........................ 327/359
5,467,046 A * 11/1995 Kimura ....................... 327/351
5,742,199 A * 4/1998 Shoji et al. .................. 327/552
5,764,559 A * 6/1998 Kimura ....................... 708/835
5,883,539 A * 3/1999 Kimura ....................... 327/359
5,886,560 A * 3/1999 Kimura ....................... 327/359
5,886,916 A * 3/1999 Muraoka .................... 364/841
6,456,142 B1 * 9/2002 Gilbert ....................... 327/356
6,563,365 B1 * 5/2003 Knierim et al. .............. 327/355

FOREIGN PATENT DOCUMENTS

EP        0 296 131        12/1988

* cited by examiner

*Primary Examiner*—Timothy R. Callahan
*Assistant Examiner*—Hiep Nguyen
(74) *Attorney, Agent, or Firm*—Lisa K. Jorgenson; Robert Iannucci; Seed IP Law Group PLLC

(57) ABSTRACT

The invention relates to a low supply voltage analog multiplier which comprises a pair of differential cells, each cell comprising a pair of bipolar transistors with coupled emitters. A first transistor of each cell receives an input signal on its base terminal and has its collector terminal coupled to a first voltage reference through a bias member. Advantageously, the second transistor of each cell is a diode configuration, and the cells are interconnected at a common node corresponding to the base terminals of the second transistors in each pair. This multiplier can be supplied very low voltages and still exhibit a high rate of operation along with reduced harmonic distortion of the output signal, even with input signals of peak-to-peak amplitude above 600 mV.

18 Claims, 2 Drawing Sheets

LOW SUPPLY VOLTAGE ANALOG MULTIPLIER

TECHNICAL FIELD

This invention relates to an improved analog multiplier, wherein enhanced accuracy at low supply voltages is achieved for but a minimal increase in circuit area.

More particularly, the invention relates to a low supply voltage analog multiplier which comprises a pair of differential cells, with each cell being comprised of a pair of bipolar transistors with coupled emitters, a first transistor of each cell receiving an input signal on its base terminal and having its collector terminal coupled to a first voltage reference through a bias member.

BACKGROUND OF THE INVENTION

The processing of analog signals often requires circuits which can output a proportional signal to the product of two analog input signals.

Such circuits are commonly termed analog multipliers. For example, analog multipliers are used for balancing modulators, as well as in phase detectors and the like devices. With digital signal converters having a quadratic type of transfer function, it is essential that an analog multiplier be employed to produce a proportional signal to two analog input signals which are identical with each other.

A large number of analog multipliers are based on an exponential transfer function of bipolar transistors (BJTs). Actually, a differential stage with coupled emitters may constitute an elementary multiplier cell capable of generating (differential) collector output currents which are dependent on a differential voltage applied to its inputs, e.g., to the base terminals of a bipolar transistor pair forming the differential stage.

By duplicating an elementary cell, analog multipliers can be obtained which can operate between two or among four quadrants of a differential plane of input voltages.

A typical cell of a four-quadrant multiplier is referred to in the literature as Gilbert's cell or circuit.

A reference for this circuit structure is, for example, IEEE Journal of Solid-State Circuits, vol. sc-19, No. 6, December 1974, New York, U.S.A., pages 364–373, Berrie Gilbert "A High-Performance Monolithic Multiplier Using Active Feedback."

In multipliers of this kind, an expedient is often resorted to in order to reduce the error introduced by non-linearities of the circuit. Briefly, a pre-distortion stage is connected in, upstream of the analog multiplier, to introduce pre-distortion in the input signal and compensate for the hyperbolic tangent transfer characteristic of the multiplier cell.

The pre-distortion stage is usually in the form of a diode-configured bipolar transistor whereby a current input signal is forced to produce a voltage output signal having a transfer function which is the reciprocal of the hyperbolic tangent.

Multipliers of this type are known in the literature, e.g., from a book "Analog Integrated Circuits—Analysis and Design" by Paul R. Grey and Robert G. Meyer, McGraw-Hill, which contains a detailed description and an analysis of these circuits under Chapter 10, pages 694–705.

The basic characteristics expected of an analog multipliers include: high accuracy, relatively low power consumption, and moderate circuit complexity.

However, obtaining one of these characteristics sometimes involves the need for a trade-in with one or all of the other characteristics.

In particular, the prior analog multipliers mentioned above cannot be implemented with low supply voltages.

Also, the common mode output voltage varies as the potential at a central node of the multiplier, which potential is equal to the half sum of the inputs, and this makes conventional multipliers too readily affected by sharp variations in the input signal.

Finally, the accuracy of DC gain is dependent on the value of I of the bias generators.

SUMMARY OF THE INVENTION

An embodiment of this invention provides an analog multiplier structure of uniquely simple constructional and functional features, which can be supplied a very low supply voltage and allows a plurality of stages to be cascade connected to enhance input linearity while retaining a fair speed, thereby overcoming the limitations of prior solutions. The analog multiplier is highly reliable in operation and comparatively inexpensive to manufacture.

The multiplier is one in which the dynamic of the signal at the heads of the compressor and of the expander is constant regardless of the multiplier value of gain. This ensures a multiplier harmonic distortion which is constant and independent of the multiply factor of the stage. The analog multiplier includes a plurality of cells each with second transistor in a diode configuration. The cells are interconnected at a common node corresponding to the base terminals of the second transistors in each pair.

The features and advantages of a multiplier according to the invention will be apparent from the following description of an embodiment thereof, given by way of non-limitative example with reference to the accompanying drawings.

DETAILED DESCRIPTION OF THE INVENTION

Figure 1:
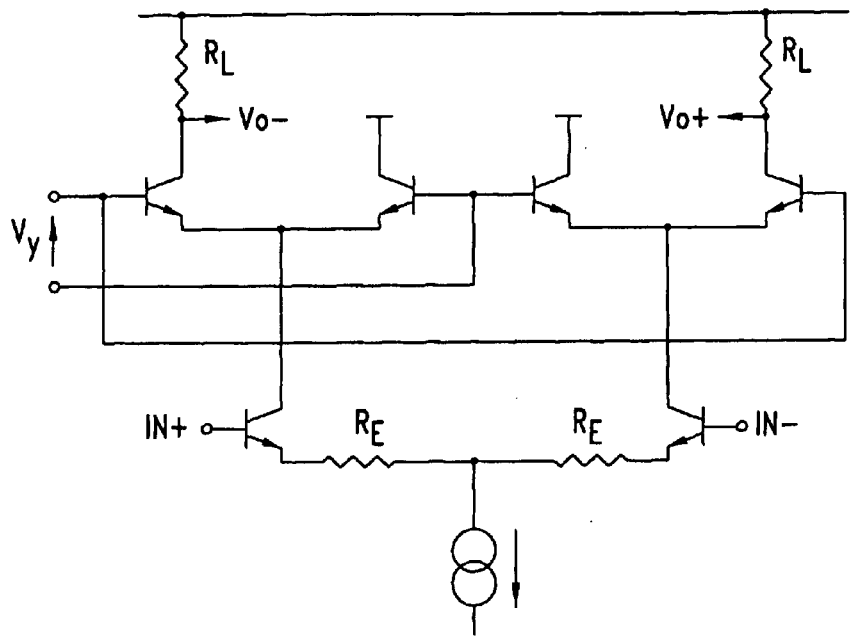
FIG. 1 shows schematically an analog multiplier according to the prior art.
Figure 2:
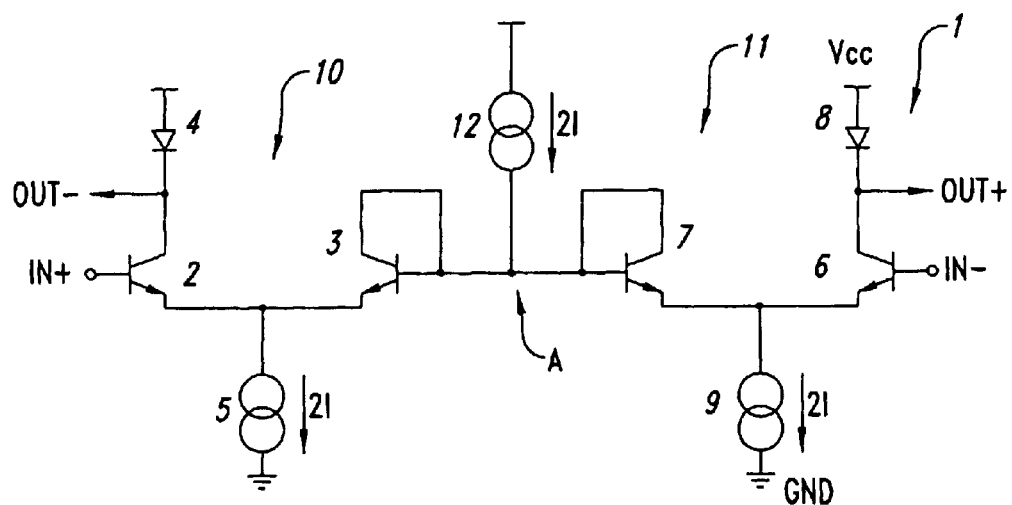
FIG. 2 shows schematically an analog multiplier according to the invention.

With reference to the drawings, in particular to FIG. 2 thereof, the circuit structure of an analog multiplier embodying this invention and preferably intended for use in signal modulators, is shown generally at 1 in schematic form.

The structure 1 includes a first circuit portion 10 and a second circuit portion 11 connected to each other. These portions 10, 11 are essentially differential cells interconnected into a fully differential configuration.

The first portion or cell 10 comprises a first bipolar transistor 2 which has a control terminal, being its base terminal, arranged to receive a first input signal Vin+.

The first transistor 2 has a conduction terminal, being its collector terminal, connected to a first supply voltage reference Vcc through a diode 4 which is forward biased to the power supply.

The collector node forms a first output terminal OUT− of the multiplier 1.

The portion 10 further comprises a second bipolar transistor 3 having its emitter terminal connected to the emitter terminal of the first transistor 2.

The emitter terminals of the first 2 and the second 3 transistors are connected to a second voltage reference GND through a current generator 5 which is to deliver a current 2I.

The base and collector terminals of the second transistor 3 are interconnected, thus providing a diode configuration of the transistor.

The base terminal of the second transistor 3 also forms a node A of interconnection for the first 10 and the second 11 cells of the circuit structure 1.

The second cell 11 is similar to the first and connected to the first cell 10 in mirror-image relationship. The second cell 11 also comprises a first bipolar transistor 6 having a base terminal arranged to receive a second input signal Vin−.

The first transistor 6 of the second cell 11 has a collector terminal connected to the first supply voltage reference Vcc through a diode 8 which is forward biased to the power supply.

The collector node forms a second output terminal OUT+ of the multiplier 1.

The second cell 11 further comprises a second bipolar transistor 7 having its emitter terminal connected to the emitter terminal of the first transistor 6.

The emitter terminals of the first 6 and the second 7 transistors of the second cell 11 are connected to the second voltage reference GND through a current generator 9 which is to deliver a current 2I.

The base and collector terminals of the second transistor 7 are interconnected, thus providing a diode configuration of the transistor.

Advantageously, a current generator 12, delivering a current 2I to the node A, is connected between the node A interconnecting the cells 10, 11 and the first voltage reference Vcc.

The transistors of the structure 1 are all npn bipolar transistors. However, the circuit could be arranged to comprise pnp transistors instead.

In an alternative embodiment, moreover, the second transistor 7 of the second cell 11 may be slightly larger than the second transistor 3 of the first cell 10, e.g., to a dimensional ratio of 1.8.

By changing the value of the current I of the generators 5, 9 and 12, the transconductance value of the transistors 3 and 7 can be made to change, thus varying the gain value of the multiplier.

Unlike prior solutions, the multiplier 1 has a DC output voltage Vout which remains fixed as the current I of the bias generators varies, this being an optimum condition for a minimal harmonic distortion.

Figure 3:
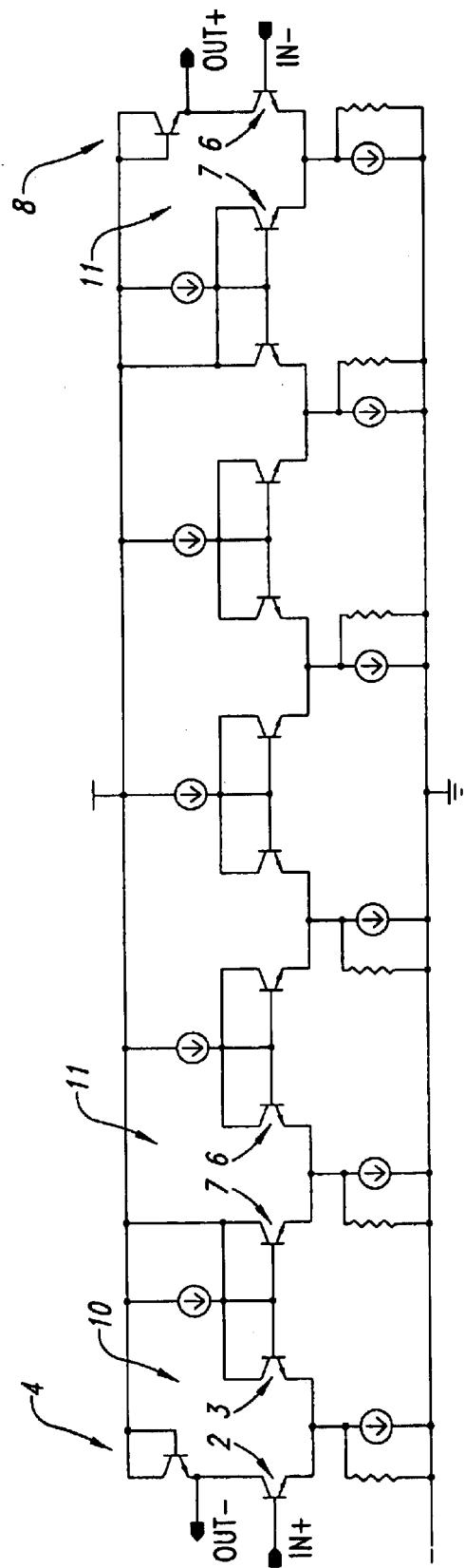
FIG. 3 is a more detailed view of a set of cascade-connected multipliers according to the invention.

As shown in FIG. 3, the multiplier 1 is suitable for connection in cascade with other multipliers of the same type; in this way, input linearity is enhanced. The load diodes 4, 8 would then be connected to the first cell and the last cell in the cascade.

The multiplier 1 provides a structure of uniquely simple constructional and functional features, and offers a number of advantages, foremost among which is that the multiplier can be supplied very low voltages, below 3 V.

The common mode voltage is the difference in base-emitter voltage drop between the transistors 2 and 3 of FIG. 2.

The circuit structure 1 is quite simple, and has shown to be extremely fast.

Changes and modifications may be made unto the structure described hereinabove, within the scope of the invention as defined in the accompanying claims.

What is claimed is:

1. A multiplier comprising: a pair of differential cells, with each cell being comprised of a pair of bipolar transistors with coupled emitters, a first transistor of each cell receiving an input signal on its base terminal and having its collector terminal coupled to a first voltage reference trough a bias member, the second transistor of each cell having a diode configuration, the cells being interconnected at a common node corresponding to base terminals of the second transistors in each pair, and a first current generator connected between said first voltage reference and said common node, wherein the second transistor of the second cell exceeds in area the second transistor of the first cell.

2. A multiplier according to claim 1, further comprising a second current generator connected between the coupled emitters of the first cell a second voltage reference; and a third current generator connected between the coupled emitters of the second cell and the second voltage reference, the second and third current generators each being structured to deliver a current equal to a current from said first current generator connected to said common node.

3. A multiplier according to claim 1, wherein the collector terminals of the first transistors in each pair form differential output of the multiplier.

4. A multiplier according to claim 1, having a fully differential configuration.

5. A multiplier according to claim 1, wherein all the transistors are npn bipolar transistors.

6. The multiplier according to claim 1, wherein the second transistor of the second cell is structured to conduct a greater portion of a current received at the common node than the second transistor of the first cell.

7. A multiplier comprising a pair of differential cells, with each cell being comprised of a pair of bipolar transistors with coupled emitters, a first transistor of each cell receiving an input signal on its base terminal and having its collector terminal coupled to a first voltage reference through a bias member, the second transistor of each cell having a diode configuration, wherein the second transistor of the second cell exceeds in area the second transistor of the first cell, and the cells being interconnected at a common node corresponding to base terminals of the second transistors in each pair wherein said bias member comprises a diode which is forward biased to the first supply voltage reference.

8. A multiplier circuit comprising:
   a differential input having first and second terminals;
   a differential output having first and second terminals;
   a first cell having first and second transistors, the first transistor having a base coupled to the first terminal of the differential input, a collector coupled to the first terminal of the differential output, an emitter coupled to a first reference supply, and the second transistor having a base and collector coupled to a common node of the first cell and an emitter coupled to the first reference supply; and
   a plurality of second cells coupled successively in cascade, the plurality having a first input coupled to the common node of the first cell, a second input coupled to the second terminal of the differential input and an output coupled to the second terminal of the differential output, each second cell includes:
   a first transistor having a base and a collector coupled to a common node of the second cell, and an emitter coupled to the first reference supply;

a second transistor having a base and a collector coupled to the common node of the first transistor a preceding second cell or the second transistor of the first cell, and an emitter coupled to the first reference supply, wherein the second transistor of the second cell is larger than the first transistor of the second cell; and a current source coupled between the common node of the second cell and a second reference suppl.

9. The multiplier circuit according to claim 8 wherein the plurality of second cells includes an integer number of second cells such that a range of linearity of the differential input is representative of the integer number.

10. The multiplier circuit according to claim 8 wherein a signal gain of the multiplier is linearly proportional to a current of the current source of the second cell of the plurality of second cells.

11. An analog multiplier, comprising:

a plurality of differential cells each comprising first and second transistors, the second transistor of each cell having a diode configuration;

means, coupled to the plurality of differential cells, for compensating for a hyperbolic transfer characteristic of the analog multiplier; and means, coupled to the plurality of differential cells, for varying a gain value of the analog multiplier, wherein an area of the second transistor of a first differential cell in the plurality of differential cells exceeds an area of the second transistor of a second differential cell in the plurality of differential cells.

12. The analog multiplier of claim 11 wherein the compensating means comprises:

a first bias member coupled to the first transistor of a first differential cell in the plurality of differential cells; and a second bias member coupled to the first transistor of a second differential cell in the plurality of differential cells.

13. The analog multiplier of claim 12 wherein the first bias member is a diode.

14. The analog multiplier of claim 12 wherein the varying means comprises a plurality of current generators coupled to the plurality of differential cells.

15. The analog multiplier of claim 14 wherein the plurality of differential cells consists of two differential cells and the plurality of current generators consist of three current generators.

16. A method of multiplying two analog signals, the method comprising:

interconnecting a plurality of differential cells in a fully differential configuration;

applying a first analog signal across the interconnected plurality of interconnected cells;

compensating for a hyperbolic transfer characteristic of the interconnected plurality of differential cells; and controlling a gain value of the interconnected plurality of differential cells, wherein controlling a gain value of interconnected plurality of differential cells comprises conducting a first current through a first differential cell of the interconnected plurality of differential cells and a second current through a second cell of the interconnected plurality of differential cell, wherein the first current is smaller than the second. current.

17. The method of claim 16 wherein compensating for a hyperbolic transfer characteristic of the interconnected plurality of differential cells comprises coupling a bias element between an output of the interconnected plurality of differential cells and a reference voltage.

18. The method of claim 17 wherein controlling a gain value of the interconnected plurality of differential cells comprises coupling a plurality of current generators to the interconnected plurality of differential cells.

* * * * *

UNITED STATES PATENT AND TRADEMARK OFFICE
CERTIFICATE OF CORRECTION

| | |
|---|---|
| PATENT NO. | : 7,061,300 B2 |
| APPLICATION NO. | : 09/797204 |
| DATED | : June 13, 2006 |
| INVENTOR(S) | : Valerio Pisati et al. |

It is certified that error appears in the above-identified patent and that said Letters Patent is hereby corrected as shown below:

Face of the Patent
Section (56)… References Cited, under U.S. Patent Documents, two references have been omitted and should be incorporated to read as
-- 5,994,959…A…*…11/1999…Ainsworth…330/252 -- and
-- 6,028,459…A…*…2/2000…Birdsall…327/94 --

Column 4
Line 9, "terminal coupled to a first voltage reference trough a bias" should read as
-- terminal coupled to a first voltage reference through a bias --

Column 4
Line 19, "emitters of the first cell a second voltage reference;" should read as -- emitters of the first cell and a second voltage reference; --

Column 4
Line 25, "A multiplier according claim 1, wherein the collector" should read as -- A multiplier according claim 2, wherein the collector --

Column 4
Line 27, "output of the multiplier" should read as -- outputs of the multiplier --

Column 4
Line 28, "A multiplier according claim 1, having a fully" should read as -- A multiplier according claim 2, having a fully --

Column 4
Line 30, "A multiplier according claim 1, wherein all the" should read as -- A multiplier according claim 2, wherein all the --

Column 5
Line 2, "to the common node of the first transistor a preceding" should read as -- to the common node of the first transistor of a preceding --

Column 5
Line 8, "second cell and a second reference suppl." should read as -- second cell and a second reference supply. --

UNITED STATES PATENT AND TRADEMARK OFFICE
CERTIFICATE OF CORRECTION

| | |
|---|---|
| PATENT NO. | : 7,061,300 B2 |
| APPLICATION NO. | : 09/797204 |
| DATED | : June 13, 2006 |
| INVENTOR(S) | : Valerio Pisati et al. |

It is certified that error appears in the above-identified patent and that said Letters Patent is hereby corrected as shown below:

Columns 4 and 5
Lines 65-67 and 1-8 respectively,
"a first transistor having a base and a collector coupled to a common node of the second cell, and an emitter coupled to the first reference supply;
a second transistor having a base and a collector coupled to the common node of the first transistor a preceding second cell or the second transistor of the first cell, and an emitter coupled to the first reference supply, wherein the second transistor of the second cell is larger than the first transistor of the second cell; and
a current source coupled between the common node of the second cell and a second reference suppl."
should read as
-- a first transistor having a base and a collector coupled to a common node of the second cell, and an emitter coupled to the first reference supply;
a second transistor having a base and a collector coupled to the common node of the first transistor of a preceding second cell or the second transistor of the first cell, and an emitter coupled to the first reference supply, wherein the second transistor of the second cell is larger than the first transistor of the second cell; and
a current source coupled between the common node of the second cell and a second reference supply. --

Column 6
Line 8, "and the plurality of current generators consist of three" should read as -- and the plurality of current generators consists of three --

Column 6
Line 16, "plurality of interconnected cells;" should read as -- plurality of differential cells; --

Column 6
Lines 20-21, "wherein controlling a gain value of interconnected plurality of differential cells" should read as -- wherein controlling a gain value of the interconnected plurality of differential cells --

UNITED STATES PATENT AND TRADEMARK OFFICE
CERTIFICATE OF CORRECTION

PATENT NO.       : 7,061,300 B2
APPLICATION NO.  : 09/797204
DATED            : June 13, 2006
INVENTOR(S)      : Valerio Pisati et al.

It is certified that error appears in the above-identified patent and that said Letters Patent is hereby corrected as shown below:

Column 6
Lines 25-26, "plurality of differential cell, wherein the first current is smaller than the second current." should read as -- plurality of differential cells, wherein the first current is smaller than the second current. --

Signed and Sealed this

Sixth Day of January, 2009

JON W. DUDAS
*Director of the United States Patent and Trademark Office*